(12) United States Patent
Inagaki et al.

(10) Patent No.: US 7,679,923 B2
(45) Date of Patent: Mar. 16, 2010

(54) METHOD FOR APPLYING COATING AGENT AND ELECTRONIC CONTROL UNIT

(75) Inventors: Tatsuya Inagaki, Kariya (JP); Toshio Kohno, Nagoya (JP)

(73) Assignee: JText Corporation, Osaka-shi (JP)

( * ) Notice: Subject to any disclaimer, the term of this patent is extended or adjusted under 35 U.S.C. 154(b) by 105 days.

(21) Appl. No.: 11/550,527

(22) Filed: Oct. 18, 2006

(65) Prior Publication Data

US 2007/0134951 A1 Jun. 14, 2007

(30) Foreign Application Priority Data

Oct. 18, 2005 (JP) .............................. 2005-302847

(51) Int. Cl.
*H05K 7/00* (2006.01)
(52) U.S. Cl. ...................... 361/752; 361/728; 361/730; 29/867; 174/521
(58) Field of Classification Search ................. 361/752, 361/730, 728; 174/521; 29/841, 855, 883, 29/867
See application file for complete search history.

(56) References Cited

U.S. PATENT DOCUMENTS

| | | | | |
|---|---|---|---|---|
| 4,893,215 A | | 1/1990 | Urushiwara et al. | |
| 5,285,559 A | * | 2/1994 | Thompson et al. | 29/841 |
| 5,293,002 A | * | 3/1994 | Grenet et al. | 174/541 |
| 5,381,304 A | * | 1/1995 | Theroux et al. | 361/706 |
| 5,408,383 A | * | 4/1995 | Nagasaka et al. | 361/707 |
| 5,420,752 A | * | 5/1995 | Variot | 361/709 |
| 5,519,252 A | * | 5/1996 | Soyano et al. | 257/690 |
| 5,570,272 A | * | 10/1996 | Variot | 361/723 |
| 5,604,329 A | | 2/1997 | Kressner et al. | |
| 5,610,799 A | * | 3/1997 | Kato | 361/752 |
| 5,646,827 A | * | 7/1997 | Hirao et al. | 361/707 |
| 5,692,296 A | * | 12/1997 | Variot | 29/827 |
| 5,703,754 A | * | 12/1997 | Hinze | 361/736 |
| 6,201,696 B1 | * | 3/2001 | Shimizu et al. | 361/704 |
| 6,222,122 B1 | * | 4/2001 | Davidson | 174/554 |
| 6,421,244 B1 | * | 7/2002 | Shinohara et al. | 361/736 |
| 6,549,409 B1 | * | 4/2003 | Saxelby et al. | 361/704 |
| 6,964,575 B1 | * | 11/2005 | Sailor | 439/76.1 |
| 7,120,024 B2 | * | 10/2006 | Watanabe et al. | 361/704 |
| 7,146,721 B2 | * | 12/2006 | Hunkeler et al. | 29/841 |
| 7,238,881 B1 | * | 7/2007 | Barr et al. | 174/50 |
| 7,332,800 B2 | * | 2/2008 | Kikuchi et al. | 257/686 |
| 7,375,974 B2 | * | 5/2008 | Kirigaya | 361/752 |
| 7,445,455 B2 | * | 11/2008 | Yokozuka et al. | 439/55 |
| 2005/0105276 A1 | | 5/2005 | Nichols | |
| 2005/0198819 A1 | * | 9/2005 | Hunkeler et al. | 29/841 |

(Continued)

FOREIGN PATENT DOCUMENTS

DE 103 28 005 B3 1/2005

(Continued)

*Primary Examiner*—Dameon E Levi
(74) *Attorney, Agent, or Firm*—Oblon, Spivak, McClelland, Maier & Neustadt, L.L.P.

(57) ABSTRACT

A method for easily applying a coating agent to an electronic circuit board accommodated in a housing without leaving uncoated portions. The method includes mounting the electronic circuit board to the housing, performing an electrical connection process in the electronic circuit board, and filling the housing with the coating agent (anti-moisture agent) to immerse the electronic circuit board in the coating agent.

2 Claims, 3 Drawing Sheets

U.S. PATENT DOCUMENTS

2006/0068609 A1 * 3/2006 Yokozuka et al. ............. 439/55

FOREIGN PATENT DOCUMENTS

| | | |
|---|---|---|
| EP | 0 505 271 A1 | 9/1992 |
| GB | 1 587 998 | 4/1981 |
| JP | 57-157737 | 9/1982 |
| JP | 2005-150633 | 6/2005 |

* cited by examiner

METHOD FOR APPLYING COATING AGENT AND ELECTRONIC CONTROL UNIT

CROSS-REFERENCE TO RELATED APPLICATIONS

This application is based upon and claims the benefit of priority from the prior Japanese Patent Application No. 2005-302847, filed on Oct. 18, 2005, the entire contents of which are incorporated herein by reference.

BACKGROUND OF THE INVENTION

The present invention relates to a method for applying a coating agent and to an electronic control unit.

An electronic control unit includes an electronic circuit board accommodated in a housing. In the prior art, various measures are taken to make the housing waterproof. For example, Japanese Laid-Open Patent Publication No. 2005-150633 describes an electronic control unit having a waterproof structure. In a vehicle, space is limited. It is thus important that space be effectively used. Therefore, to increase the mounting freedom of an electronic control unit in a vehicle, the electronic control unit must have higher water resistance. Accordingly, in an electronic control unit having a waterproof structure, it is desirable that the electronic circuit board be coated with an anti-moisture agent.

However, in cases in which there are locations that must undergo soldering after the electronic circuit board is mounted on the housing, the anti-moisture agent may hinder soldering. Thus, in the prior art, the soldered locations are masked before immersing the electronic circuit board in a coating agent (anti-moisture agent). Alternatively, after mounting the electronic circuit boards to the housing, the anti-moisture agent is coated on the electronic circuit board with a brush. However, such masking or coating is troublesome. Further, depending on how the electronic circuit board is accommodated in the housing, some portions of the electronic circuit board may be left uncoated by the anti-moisture agent. Accordingly, improvements must be made to the application of a coating agent.

SUMMARY OF THE INVENTION

The present invention provides a coating agent application method and an electronic control unit enabling simple application of a coating agent to an electronic circuit board accommodated in a housing without leaving uncoated portions.

One aspect of the present invention is a method for applying a coating agent to an electronic circuit board. The method includes accommodating the electronic circuit board in a housing, performing an electrical connection process on the electronic circuit board accommodated in the housing, and filling the coating agent into the housing and immersing the electronic circuit board in the coating agent.

Another aspect of the present invention is an electronic control unit including a housing capable of containing a coating agent and including a bottom for holding the coating agent. An electronic circuit board is accommodated in the housing. The housing includes an opening enabling insertion of a nozzle for drawing the coating agent into and out of the housing. The electronic circuit board includes an insertion portion for guiding the nozzle to the bottom of the housing.

A further aspect of the present invention is an electronic control unit including a housing capable of containing a coating agent. An electronic circuit board accommodated in the housing includes an electrical bonding portion. The housing has an inner bottom surface for supporting the electronic circuit board. The inner bottom surface includes a recess for accommodating the electrical bonding portion to immerse the electrical bonding portion in the coating agent.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
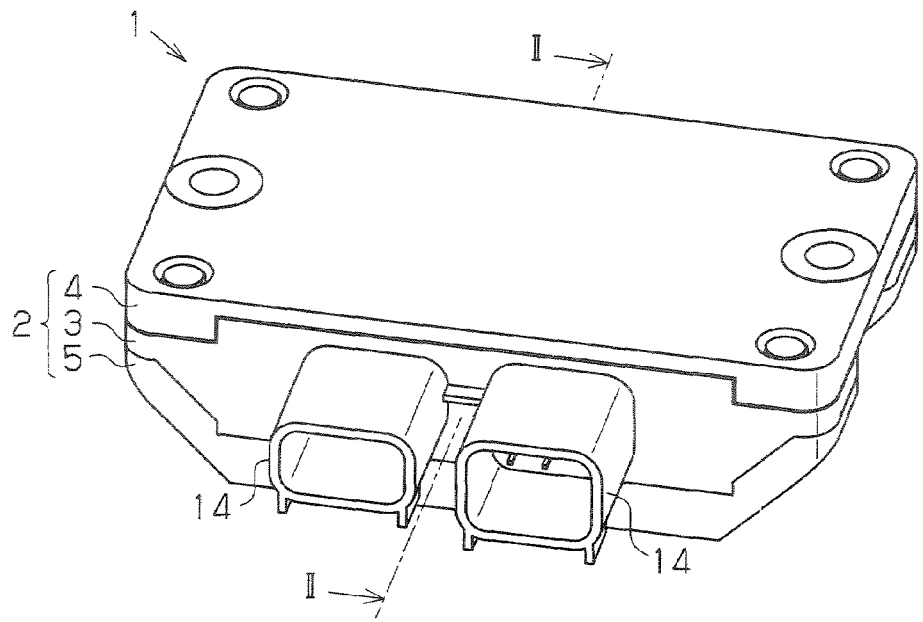
FIG. 1 is a perspective view showing an electronic control unit according to a preferred embodiment of the present invention.

In the drawings, like numerals are used for like elements throughout.

An electronic control unit 1 and a method for applying a coating agent according to a preferred embodiment of the present invention will now be described with reference to the drawings.

Figure 2:
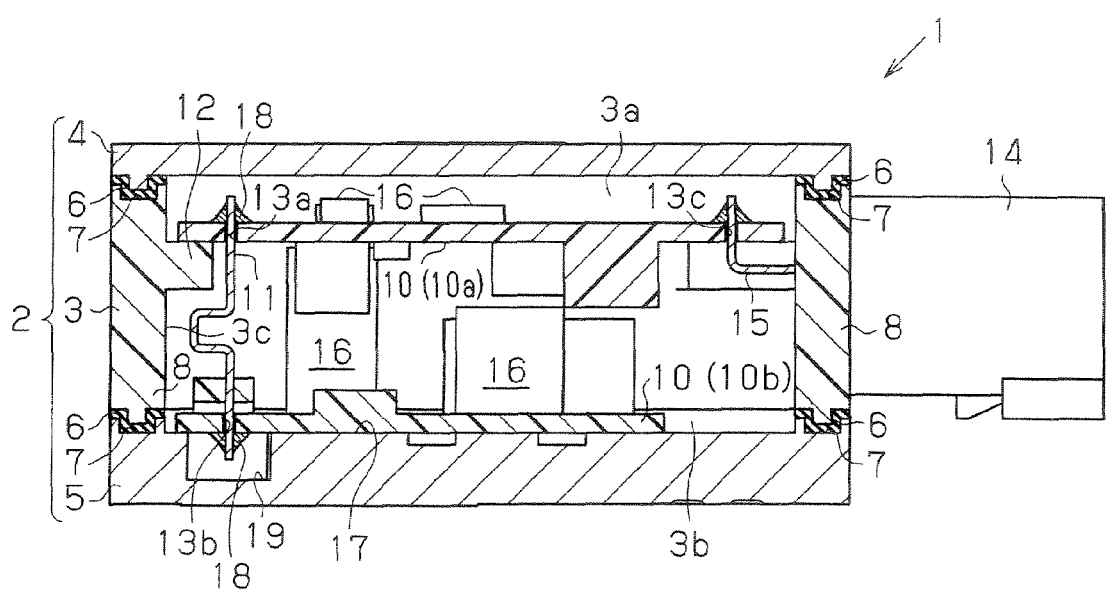
FIG. 2 is a cross-sectional view taken along line II-II in FIG. 1.
Figure 3:
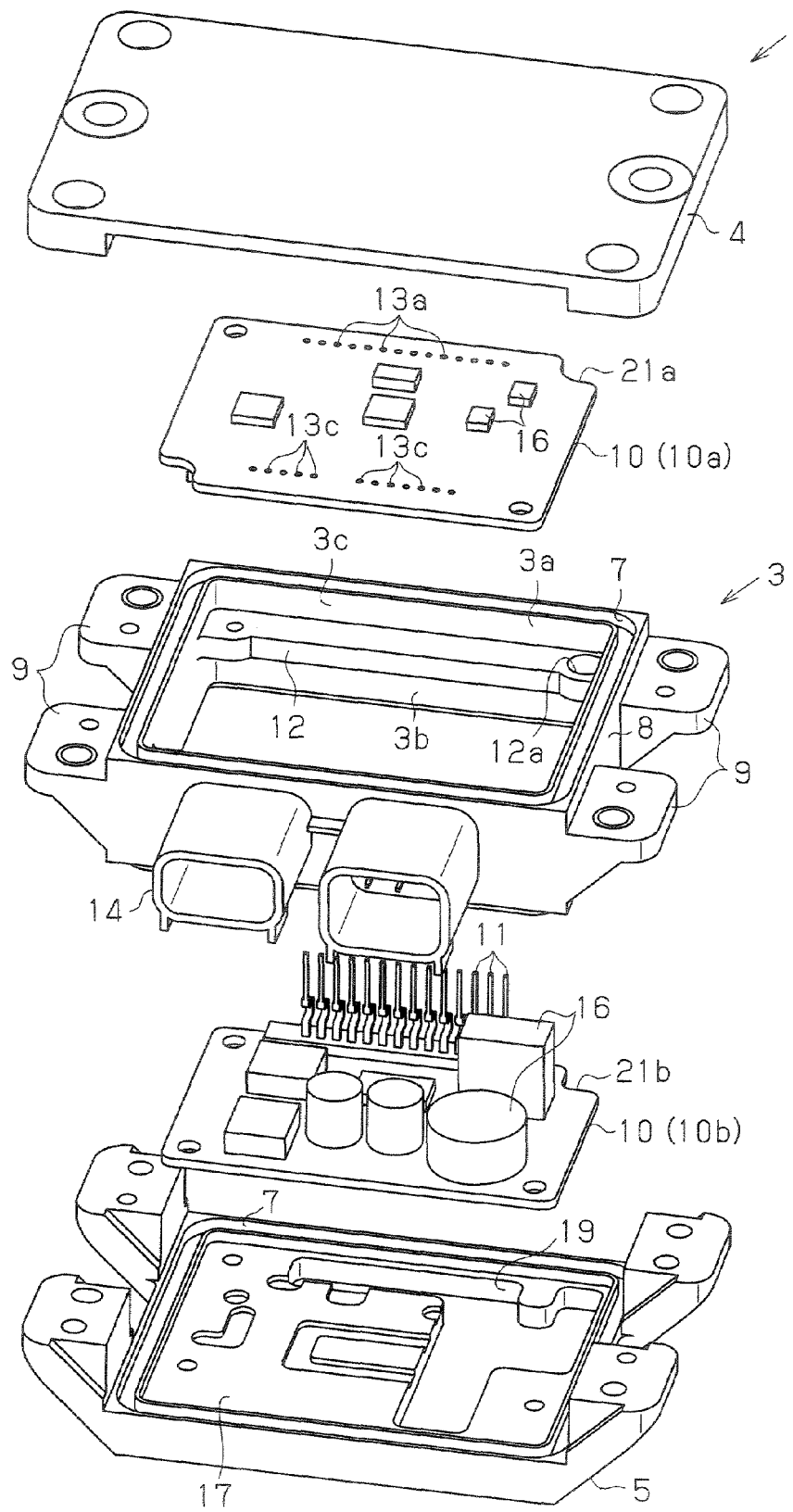
FIG. 3 is an exploded perspective view showing the electronic control unit of FIG. 1.

FIG. 1 is a perspective view showing the electronic control unit 1, FIG. 2 is a cross-sectional view taken along line II-II in FIG. 1, and FIG. 3 is an exploded perspective view showing the electronic control unit 1 of FIG. 1. As shown in FIGS. 1 to 3, a housing 2 includes a hollow housing body 3, a plate-shaped cover 4, and a base 5. The cover 4 and base 5 respectively close openings 3a and 3b of the housing body 3. A seal 6 is arranged between the cover 4 and the opening 3a of the housing body 3 and between the base 5 and opening 3b of the housing body 3. In the preferred embodiment, seal grooves 7 extend about the opening 3a on one end of the housing body 3 and on the base 5. Each seal groove 7 receives the corresponding seal 6. The housing body 3 has side walls 8 from which a plurality of flanges 9 extend. The cover 4 and the base 5 are fastened to the flanges 9 to close the openings 3a and 3b of the housing body 3. The seals 6 hermetically seal the gaps between the housing body 3 and the cover 4 and base 5.

Referring to FIG. 3, in the preferred embodiment, an electronic circuit board 10 has a double-board structure including two boards 10a and 10b. The boards 10a and 10b are electrically connected to each other by a plurality of connection terminals 11 and are arranged generally parallel to the cover 4 and the base 5. In the preferred embodiment, the housing body 3 has an inner wall surface 3c from which a plate-shaped support 12 extends. The board 10a is fastened to the support 12 and mounted on the housing body 3. Further, the boards 10a and 10b respectively have connection holes 13a and 13b. Each of the connection terminals 11 has one end inserted in a connection hole 13a of the board 10a and another end inserted in a connection hole 13b of the board 10b. The two ends of each connection terminal 11 are soldered and electrically connected to the boards 10a and 10b.

In the preferred embodiment, hollow connectors 14 for connection of wire harnesses (not shown) are formed on the side wall 8 of the housing body 3. The connector 14 includes a plurality of connector terminals 15, which extend into the housing 2 through the side wall 8. The end of each connector terminal 15 extended into the housing 2 is electrically connected to the electronic circuit board 10 accommodated in the housing 2. More specifically, each connector terminal 15 has a portion bent to be L-shaped and extended toward the board 10a. The L-shaped portion has an end inserted into a connection hole 13c of the board 10a. This end is soldered to the board 10a so that the connector terminal 15 is connected to the board 10a. As a result, external wires (not shown) in a wire harness connected to the connector 14 are connected to the electronic circuit board 10.

In the preferred embodiment, the base 5 is made of a metal having a high heat dissipation property. The base 5, which is in contact with the board 10b, functions as a heat sink that dissipates heat generated by electronic components 16 on the board 10b out of the housing 2. More specifically, in the preferred embodiment, the base 5 has an inner bottom surface 17 including a recess 19 formed in correspondence with portions of the connection terminals 11 that are soldered. Such soldered portions define electrical bonding portions 18. The electrical bonding portions 18, which extend from the board 10b toward the base 5, are arranged in the recess 19. This keeps the surface of the board 10b in close contact with the inner bottom surface 17 of the base 5 and enables effective heat dissipation.

[Method for Applying Coating Agent]

A method for applying a coating agent to the electronic circuit board 10 will now be described with reference to FIGS. 4 and 5.

Figure 4:
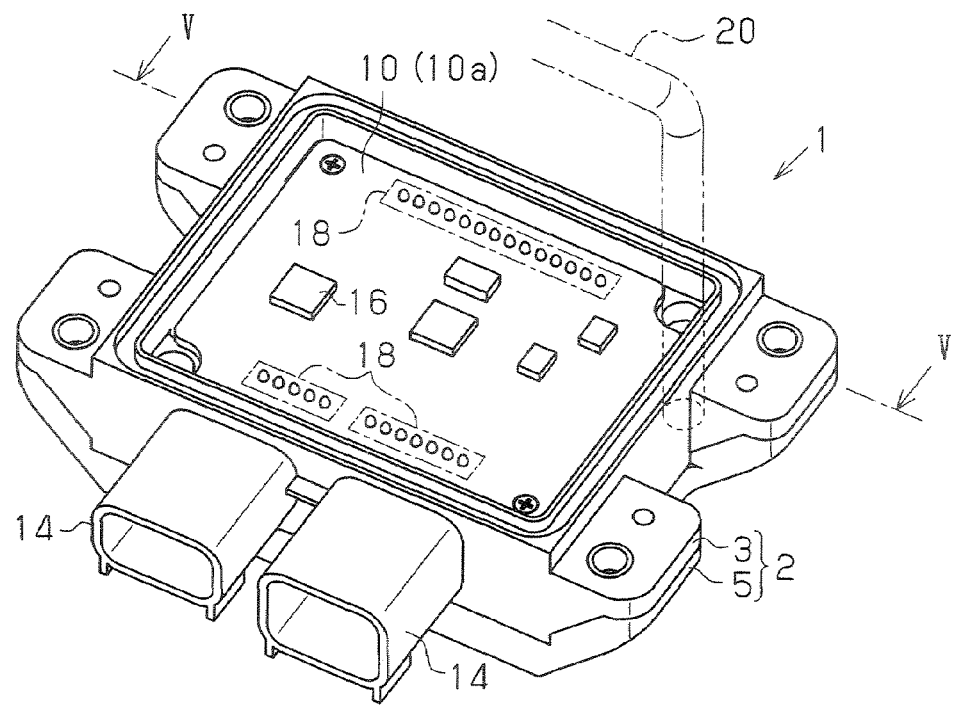
FIG. 4 is a perspective view showing the procedures for applying a coating agent in the preferred embodiment.
Figure 5:
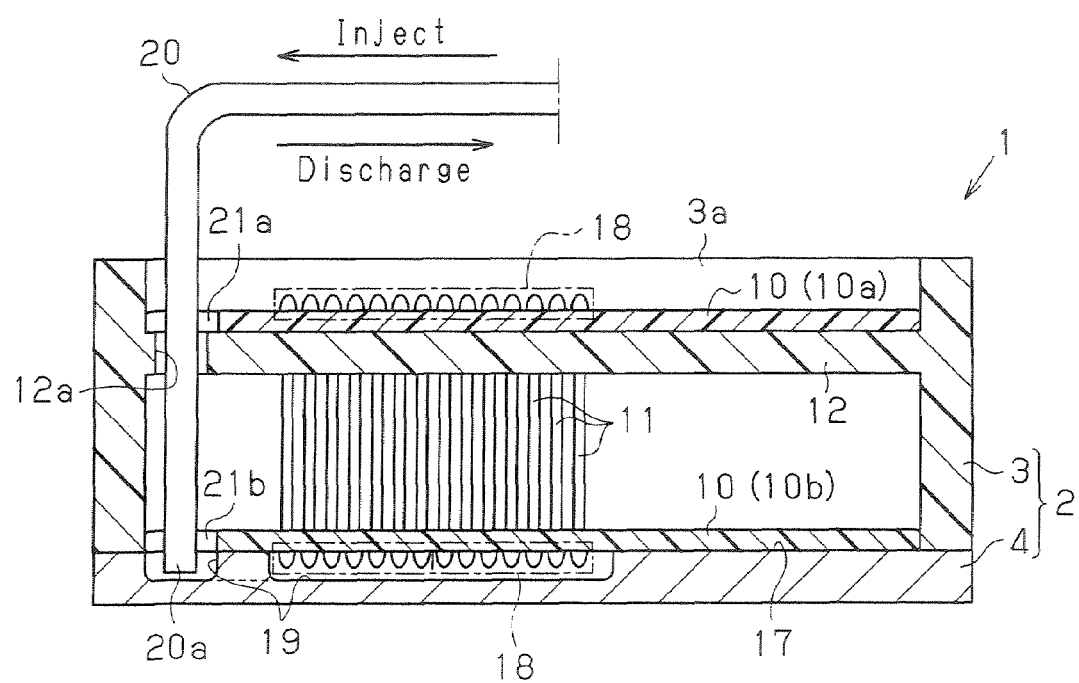
FIG. 5 is a cross-sectional view taken along line V-V in FIG. 4.

Referring to FIGS. 4 and 5, in the preferred embodiment, the electronic circuit board 10 is mounted on the housing 2. An electrical connection process (soldering) is performed to connect the boards 10a and 10b to each other. Then, a coating agent (anti-moisture agent) is filled into the housing 2. The electronic circuit board 10 is immersed in the coating agent inside the housing 2. This coats the electronic circuit board 10.

Specifically, in the preferred embodiment, the electronic circuit boards 10 (boards 10a and 10b) are mounted on the housing body 3 and undergo electrical connection. Then, the base 5 is coupled to the housing body 3. This hermetically seals the opening 3b of the housing body 3. With the base 5 facing downward, the coating agent is filled into the housing 2 from the opening 3a. At the bottom of the housing 2, the base 5 functions to hold the coating agent against the direction of gravitational force. In the preferred embodiment, the coating agent uses a polyolefin resin as a main component and methylcyclohexane as a solvent.

More specifically, in the preferred embodiment, the coating agent is injected into the housing 2 through a nozzle 20, which is inserted into the housing 2 from the opening 3a. In detail, in the preferred embodiment, the boards 10a and 10b respectively have cutout portions 21a and 21b functioning as nozzle insertion portions enabling insertion of the nozzle 20 toward the vicinity of the base 5. An insertion hole 12a is formed in the support 12 at a position corresponding to the cutout portions 21a and 21b of the boards 10a and 10b. The recess 19 formed in the inner bottom surface 17 of the base 5 extend to positions corresponding to the cutout portions 21a and 21b. The coating agent is injected into the housing 2 in a state in which an outlet 20a of the nozzle 20 is arranged in the recess 19. After the electronic circuit board 10 is immersed in the coating agent inside the housing 2, the coating agent is discharged from the housing 2 through the nozzle 20. This completes the coating process.

The electronic control unit 1 of the preferred embodiment has the advantages described below.

(1) The electronic circuit board 10 is mounted on the housing 2 and under goes an electric connection process (i.e., soldering of the boards 10a and 10b). Then, the coating agent (anti-moisture agent) is filled into the housing 2. The electronic circuit board 10 is immersed in the coating agent inside the housing 2. This coats the electronic circuit board 10.

In this manner, the coating agent is easily applied to the electronic circuit board 10 without leaving any uncoated portions even if the electronic circuit board 10 includes the stacked boards 10a and 10b. Further, the soldering process is performed before the coating process. Thus, the coating agent does not hinder the soldering process.

(2) The coating agent is injected into the housing 2 by inserting the nozzle 20 into the housing 2 from the opening 3a. The boards 10a and 10b of the electronic circuit board 10 include the cutout portions 21a and 21b, which function as nozzle insertion portions enabling the insertion of the nozzle 20 toward the vicinity of the base 5.

In this structure, the coating is drawn into and out of the housing 2 from the vicinity of the base 5, which is located at the bottom of the housing 2. This prevents bubbles from forming uncoated portions. Further, the cutout portions 21a and 21b formed in the electronic circuit board 10 enable the electronic circuit board 10 to have substantially the same size as the space in the housing 2. More specifically, the electronic circuit board 10 has substantially the same area as the section surrounded by the inner wall surface 3c of the housing 2. Thus, the space in the housing 2 may be used effectively to reduce the size of the housing 2.

(3) The inner bottom surface 17 of the base 5 includes the recess 19 for accommodating the electrical bonding portions 18, which are the soldered portions of the connection terminals 11. Thus, the surface of the board 10b remains in close contact with the inner bottom surface 17 of the base 5. This improves the heat dissipating effect of the base 5, which functions as a heat sink. Further, the coating agent is easily applied to the bonding portions 18 at which there is a tendency of uncoated portions being formed. This effectively prevents the formation of uncoated portions. Further, the amount of the coating agent entering the space between the surface of the board 10b and the base 5 is subtle. This prevents the coating agent from interfering with the transmission of heat.

(4) The coating agent is injected into the housing 2 in a state in which the outlet 20a of the nozzle 20 is arranged in the recess 19. Thus, priority is given to the electrical bonding portions 18 over other portions with regard to the supply of the coating agent. This further effectively prevents uncoated portions from being formed on the electrical bonding portions 18.

It should be apparent to those skilled in the art that the present invention may be embodied in many other specific forms without departing from the spirit or scope of the invention. Particularly, it should be understood that the present invention may be embodied in the following forms.

A housing is not limited to the housing 2, which includes the housing body 3, the cover 4, and the base 5. Any housing may be used as long as it can contain a coating agent.

The base 5 does not have to be the bottom of a housing. The bottom refers to any portion of a housing that holds a coating agent against the direction of gravitational force when the coating agent is injected into the housing.

The coating agent may be drawn into and out of the housing 2 through an opening formed in any part of the housing 2. In this case, a nozzle does not have to be used and the coating agent may be discharged from the housing 2 by inclining the housing 2.

The nozzle insertions portions do not have to be formed by the cutout portions 21*a* and 21*b* and may be holes formed in the boards 10*a* and 10*b*.

The present examples and embodiments are to be considered as illustrative and not restrictive, and the invention is not to be limited to the details given herein, but may be modified within the scope and equivalence of the appended claims.

What is claimed is:

1. A method for applying a coating agent to an electronic circuit board, the method comprising the steps of:

accommodating the electronic circuit board in a housing;

performing an electrical connection process on the electronic circuit board accommodated in the housing;

filling the coating agent into the housing and immersing the electronic circuit board in the coating agent; and discharging the coating agent from the housing, wherein said filling the coating agent includes injecting the coating agent so as to give priority to the immersion of an electrical bonding portion formed on a side of the electronic circuit board which faces opposite to said opening.

2. The method according to claim 1, wherein:

the housing includes an opening enabling insertion of a nozzle;

said filling the coating agent step includes inserting the nozzle into the opening of the housing and injecting the coating agent; and said discharging step is performed by discharging the coating agent from the housing via the nozzle.

* * * * *

UNITED STATES PATENT AND TRADEMARK OFFICE
CERTIFICATE OF CORRECTION

| | |
|---|---|
| PATENT NO. | : 7,679,923 B2 |
| APPLICATION NO. | : 11/550527 |
| DATED | : March 16, 2010 |
| INVENTOR(S) | : Inagaki et al. |

It is certified that error appears in the above-identified patent and that said Letters Patent is hereby corrected as shown below:

On the title page, Item (73), the Assignee's information is incorrect. Item (73) should read:

-- (73) Assignee: JTEKT Corporation, Osaka-shi (JP) --

Signed and Sealed this

Eighteenth Day of May, 2010

David J. Kappos
*Director of the United States Patent and Trademark Office*